United States Patent
Furuta et al.

(10) Patent No.: US 8,497,893 B2
(45) Date of Patent: Jul. 30, 2013

(54) SEMICONDUCTOR DEVICE, OPTICAL PRINT HEAD AND IMAGE FORMING APPARATUS

(75) Inventors: Hironori Furuta, Gunma (JP); Yusuke Nakai, Gunma (JP); Hiroyuki Fujiwara, Gunma (JP)

(73) Assignee: Oki Data Corporation, Tokyo (JP)

( * ) Notice: Subject to any disclaimer, the term of this patent is extended or adjusted under 35 U.S.C. 154(b) by 391 days.

(21) Appl. No.: 12/805,041

(22) Filed: Jul. 8, 2010

(65) Prior Publication Data

US 2011/0007124 A1  Jan. 13, 2011

(30) Foreign Application Priority Data

Jul. 10, 2009  (JP) ................... 2009-163721

(51) Int. Cl.
- *B41J 2/435* (2006.01)
- *B41J 27/00* (2006.01)
- *H01L 29/18* (2006.01)

(52) U.S. Cl.
USPC .............................. 347/237; 347/256; 257/88

(58) Field of Classification Search
USPC ...................... 347/256, 237; 257/88
See application file for complete search history.

(56) References Cited

U.S. PATENT DOCUMENTS

| | | | |
|---|---|---|---|
| 2003/0071267 A1* | 4/2003 | Ohtsuka et al. | 257/88 |
| 2003/0090561 A1* | 5/2003 | Sekiya et al. | 347/237 |
| 2007/0075330 A1* | 4/2007 | Ogihara et al. | 257/134 |

FOREIGN PATENT DOCUMENTS

| | | | |
|---|---|---|---|
| JP | 2006-237303 A | 9/2006 |
| JP | 2007-081081 A | 3/2007 |
| JP | 2008-166610 A | 7/2008 |
| WO | WO-2008/155940 A1 | 12/2008 |

OTHER PUBLICATIONS

Thyrsitor(online). Retrieved on Sep. 21, 2012.Retrieved from http://en.wikipedia.org/wiki/Thyristor.*

* cited by examiner

*Primary Examiner* — Stephen Meier
*Assistant Examiner* — Sarah Al Hashimi
(74) *Attorney, Agent, or Firm* — Rabin & Berdo, P.C.

(57) ABSTRACT

A semiconductor device includes three-terminal light emitting element array provided on a substrate, which includes a plurality of three-terminal light emitting elements which are substantially linearly arranged. Each three-terminal light emitting elements includes a first, second and third terminals. The third terminal is used to control a current between the first and second terminals. A Lead-out wiring portion is connected to the plurality of three-terminal light emitting elements. The three-terminal light emitting element array includes a common layer provided between two or more three-terminal light emitting elements adjacent to each other. The common layer mutually connects the second terminals (or the third terminals) of the two or three three-terminal light emitting elements. The lead-out wiring portion includes wirings led from the common layer and the plurality of three-terminal light emitting elements and extending in a direction substantially perpendicular to an arranging direction of the plurality of three-terminal light emitting elements.

8 Claims, 9 Drawing Sheets

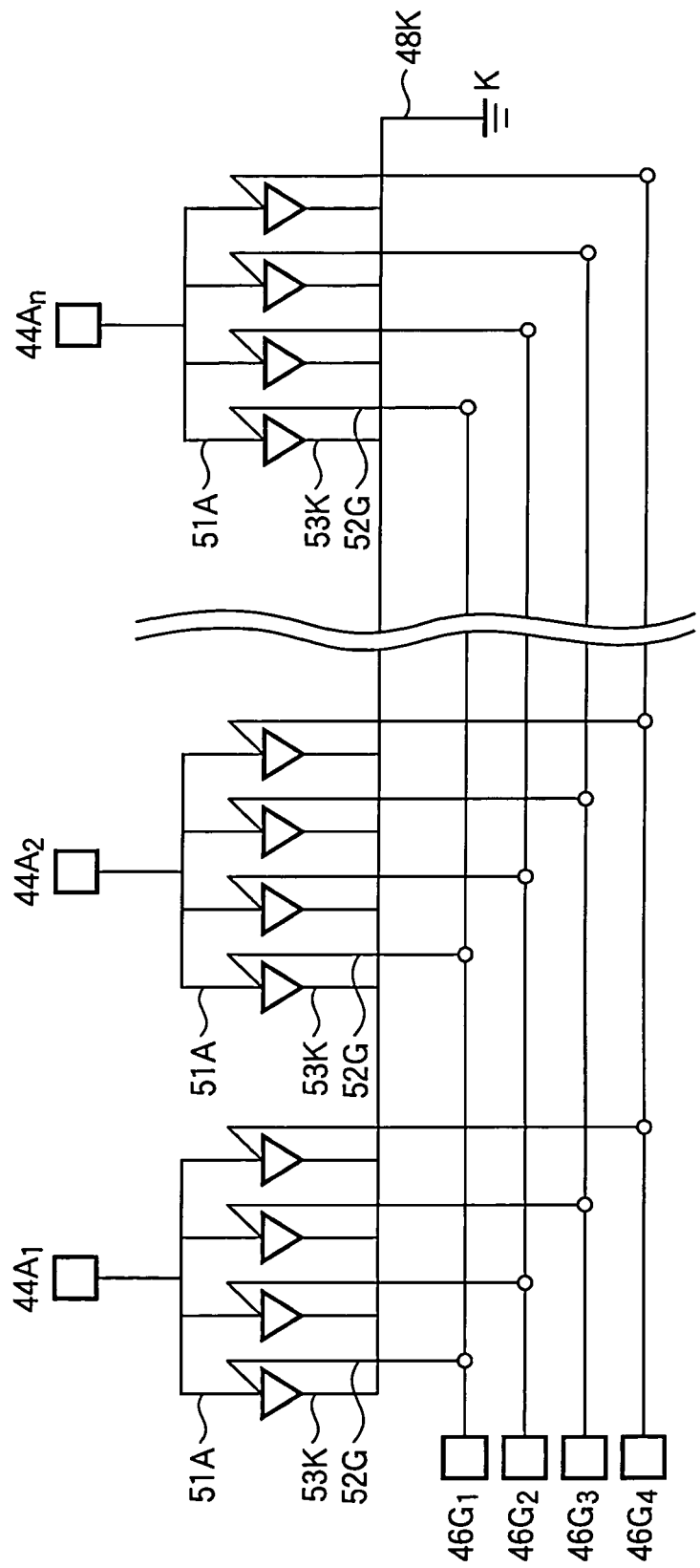

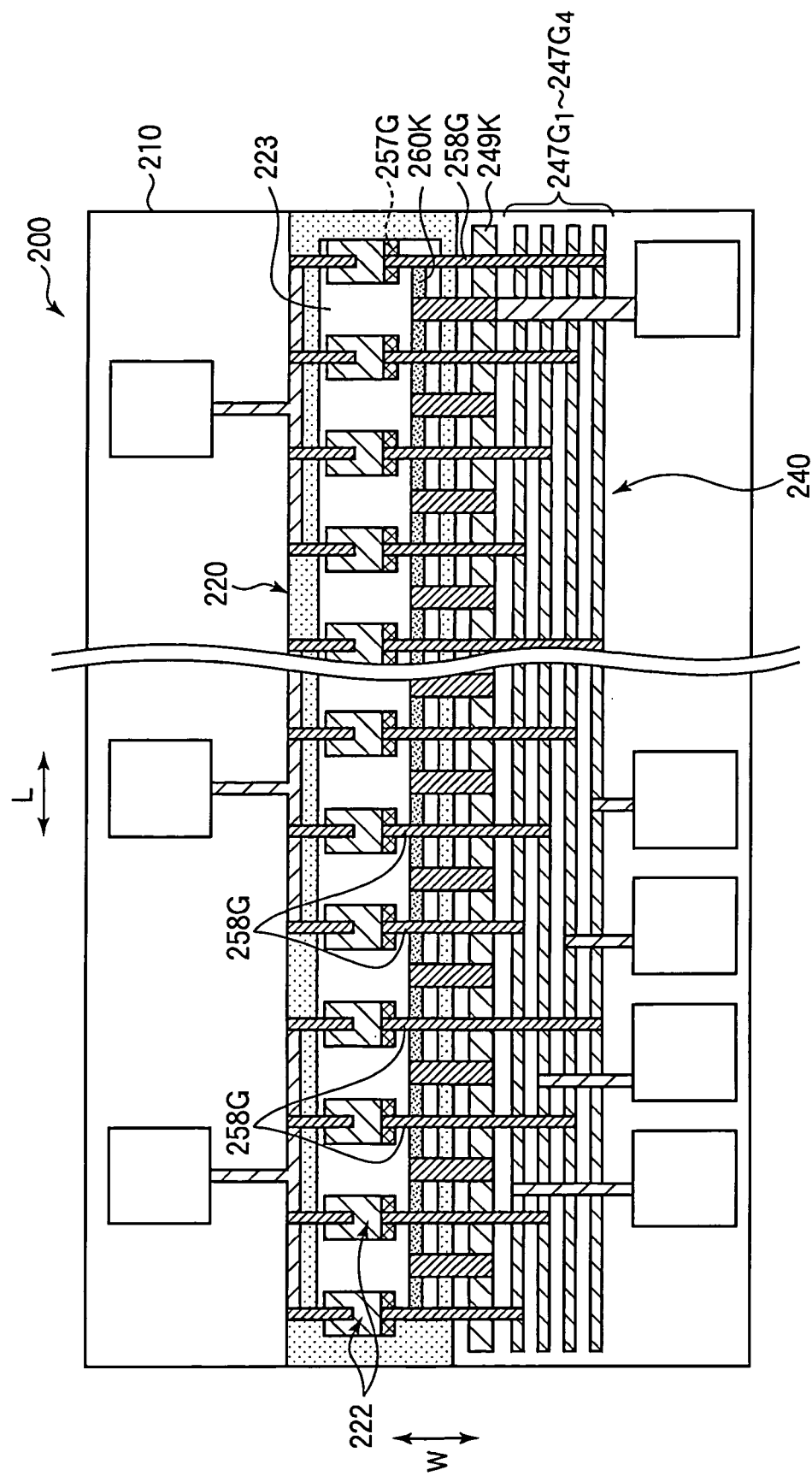

SEMICONDUCTOR DEVICE, OPTICAL PRINT HEAD AND IMAGE FORMING APPARATUS

BACKGROUND OF THE INVENTION

The present invention relates to a semiconductor device with an array of three-terminal type light emitting elements such as light emitting thyristors, an optical print head using such a semiconductor device, and an image forming apparatus using such an optical print head.

An image forming apparatus such as a printer, a copier, a facsimile machine or a combined machine includes an optical print head with an LED (Light Emitting Diode) array chip (i.e., a semiconductor device).

The LED array chip includes a plurality of LEDs linearly arranged on a substrate, a common wiring portion connected to external driving circuits for driving the LEDs, and a lead-out wiring portion for connecting the LEDs and the common wiring portion.

Patent Document 1 discloses a technique in which a semiconductor epitaxial film (including a light emitting layer) is bonded onto a substrate using intermolecular force, and then the semiconductor epitaxial film is fabricated into the LED array on the substrate. The substrate has a common wiring portion (i.e., a driving IC region) formed thereon before the semiconductor epitaxial film is bonded onto the substrate. The LEDs and the common wiring portion are connected using the lead-out wiring portion (i.e., individual electrodes) extending in a direction perpendicular to an arranging direction of the LEDs.

Patent Document 1: Japanese Laid-open Patent Publication No. 2006-237303 (see, FIGS. 1, 8 and 11).

Recently, there has been developed a light emitting thyristor array chip including light emitting thyristors instead of the LEDs.

The light emitting thyristor has three terminals (i.e., an anode, a cathode and a gate), while the LED has two terminals. Therefore, the light emitting thyristor array chip has larger number of wirings and electrodes (for connecting the light emitting thyristors and the common wiring portion) than those in the LED array chip.

Recently, there is a demand for a technology capable of reducing a possibility of short circuiting, and capable of preventing an increase in size of the light emitting thyristor array chip.

SUMMARY OF THE INVENTION

The present invention is intended to provide a semiconductor device capable of reducing a possibility of short circuiting and capable of preventing an increase in size.

The present invention provides a semiconductor device including a substrate, a three-terminal light emitting element array provided on the substrate and including a plurality of three-terminal light emitting elements which are substantially linearly arranged. Each of the plurality of three-terminal light emitting elements includes a first terminal, a second terminal and a third terminal. The third terminal is used to control a current between the first and second terminals. A lead-out wiring portion is connected to the plurality of three-terminal light emitting elements. The three-terminal light emitting element array includes a common layer provided between two or more three-terminal light emitting elements adjacent to each other. The common layer mutually connects the second terminals of the two or more three-terminal light emitting elements, or mutually connects the third terminals of the two or more three-terminal light emitting elements. The lead-out wiring portion includes wirings led from the common layer and the plurality of three-terminal light emitting elements in a direction substantially perpendicular to an arranging direction of the plurality of three-terminal light emitting elements.

Since the wirings of the lead-out wiring portion extend (from the common layer and the plurality of three-terminal light emitting elements) in the direction substantially perpendicular to the arranging direction of the plurality of three-terminal light emitting elements, the wirings do not cross each other, and therefore the possibility of short circuiting can be reduced. Further, spaces between the two or more three-terminal light emitting elements can be effectively used for the lead-out wiring portion, and therefore the increase in size of the semiconductor device can be prevented.

Further scope of applicability of the present invention will become apparent from the detailed description given hereinafter. However, it should be understood that the detailed description and specific embodiments, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

In the attached drawings:

FIG. 2 is a block diagram showing a circuit configuration of the light emitting thyristor array chip according to the first embodiment of the present invention;

FIG. 5 is a plan view showing a light emitting thyristor array chip of a comparison example;

DETAILED DESCRIPTION OF THE PREFERRED EMBODIMENT

Hereinafter, embodiments and examples of the present invention will be described with reference to the attached drawings. In this regard, the present invention is not limited to the embodiments, but can be modified without departing from the scope of the invention.

First Embodiment
<Light Emitting Thyristor Array Chip 1A>

A light emitting thyristor array chip 1A (i.e., a semiconductor device) according to the first embodiment of the present invention will be described with reference to FIGS. 1 through 5.

Figure 1:
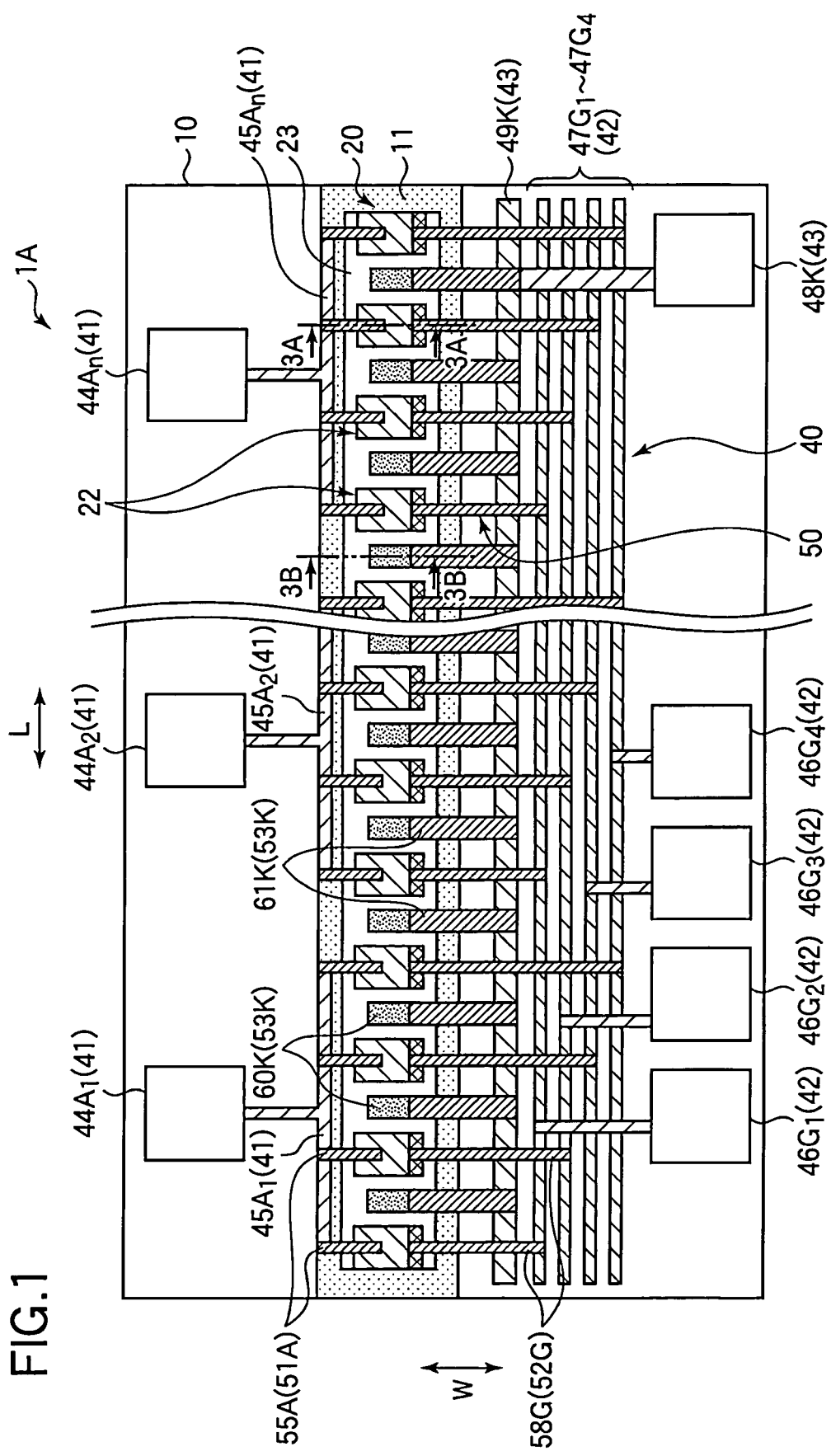
FIG. 1 is a plan view showing a light emitting thyristor array chip (as a semiconductor device) according to the first embodiment of the present invention.
Figure 3A:
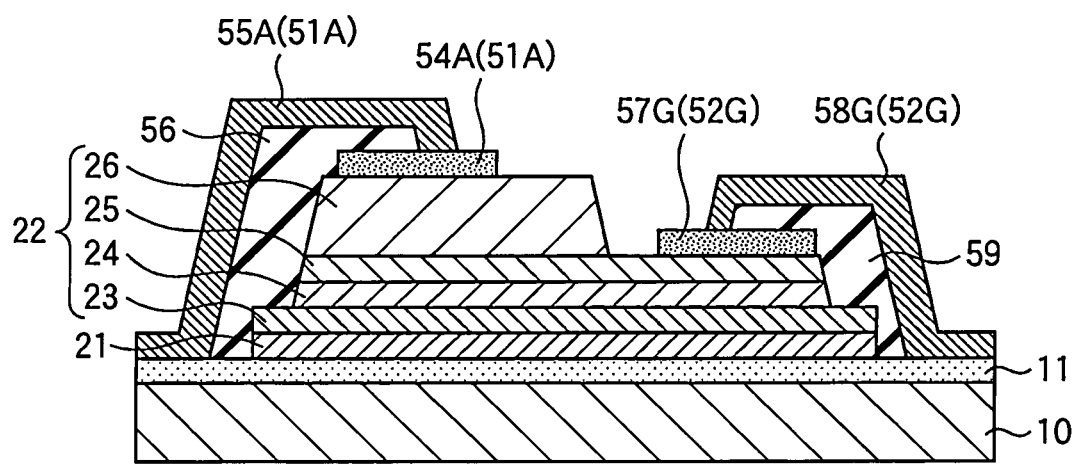
FIG. 3A is a sectional view of the light emitting thyristor array chip taken along line 3A-3A in FIG. 1.
Figure 3B:
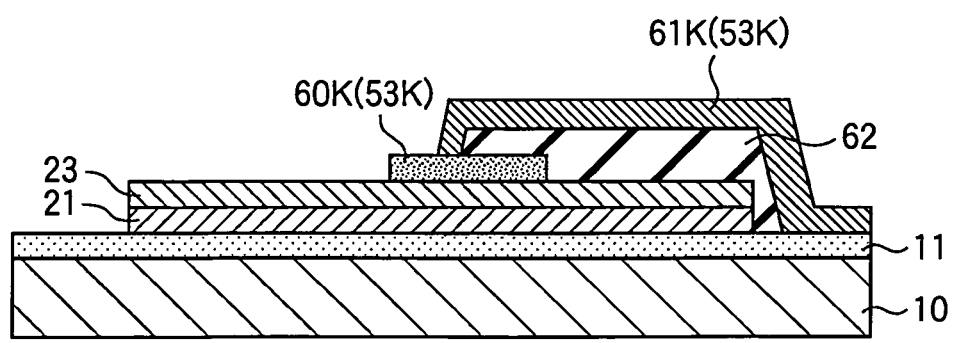
FIG. 3B is a sectional view of the light emitting thyristor array chip taken along line 3B-3B in FIG. 1.

FIG. 1 is a plan view showing the light emitting thyristor array chip 1A according to the first embodiment of the present invention. FIG. 2 is a block diagram showing a circuit configuration of the light emitting thyristor array chip 1A. FIGS. 3A and 3B are sectional views of the light emitting thyristor array chip 1A respectively taken along line 3A-3A and line 3B-3B in FIG. 1.

As shown in FIG. 1, the light emitting thyristor array chip 1A is connected to a not shown external driving circuit, and includes light emitting thyristor elements (which are substantially linearly arranged) that emit lights according to a control signal sent from the external driving circuit. The light emitting thyristor array chip 1A is used in an optical print head or the like.

The light emitting thyristor array chip 1A includes an IC (Integrated Circuit) substrate 10 and a light emitting thyristor array (i.e., a three-terminal light emitting element array) 20 provided on the IC substrate 10. The light emitting thyristor array 20 includes a plurality of light emitting thyristors (i.e., three-terminal light emitting elements) 22, a common wiring portion 40 for driving the light emitting thyristors 22 to emit lights, and a lead-out wiring portion 50 that connect the light emitting thyristors 22 and the common wiring portion 40. The light emitting thyristor array chip 1A has a circuit configuration as shown in FIG. 2.

<IC Substrate 10>

As shown in FIG. 1, the IC substrate 10 is a supporting body that supports the light emitting thyristors 22, the common wiring portion 40 and the lead-out wiring portion 50. The IC substrate 10 is composed of, for example, Si, SiC, GaN, glass, plastic or the like. A material of the IC substrate 10 is not limited.

In order to prevent electrical conduction between the IC substrate 10 and the light emitting thyristors 22, an insulation film 11 is formed on a part of the IC substrate 10 where the light emitting thyristors 22 are formed, as shown in FIGS. 1, 3A and 3B. The insulation film 11 has a high flatness.

<Light Emitting Thyristor Array 20>

The light emitting thyristor array 20 as the three-terminal light emitting element array is formed of a semiconductor epitaxial film 100 (i.e., a semiconductor thin film) as described later. The light emitting thyristor array 20 is provided on the insulation film 11 formed on the IC substrate 10 as shown in FIG. 1.

Further, the light emitting thyristor array 20 includes a bonding layer 21 (FIG. 3) and a plurality of light emitting thyristors 22 (FIG. 1) substantially linearly arranged in a longitudinal direction of the IC substrate 10. Hereinafter, the longitudinal direction (indicated by an arrow L in FIG. 1) of the IC substrate 10 will be simply referred to as a longitudinal direction. The number of the light emitting thyristors 22 is expressed as 4n, where n is a positive integer.

The bonding layer 21 is provided for bonding the semiconductor epitaxial film 100 (described later) to the insulation film 11 on the IC substrate 10 using intermolecular force as shown in FIGS. 3A and 3B. The bonding layer 21 is formed of single crystal Si.

The light emitting thyristors 22 are light emitting elements formed by etching the semiconductor epitaxial film (i.e., the semiconductor thin film) 100 having been bonded to the insulation film 11 via the bonding layer 21. Each light emitting thyristor 22 includes an n-type GaAs layer 23, a p-type GaAs layer 24, an n-type AlGaAs layer 25 and a p-type AlGaAs layer 26 which are layered in this order from the bottom as shown in FIG. 3A.

The p-type AlGaAs layer 26 constitutes a first terminal (i.e., an anode), the n-type GaAs layer 23 constitutes a second terminal (i.e., a cathode), and the n-type AlGaAs layer 25 constitutes a third terminal (i.e., a gate).

The 4n light emitting thyristors 22 (where n is a positive integer) are arranged in the longitudinal direction on the bonding layer 21. The light emitting thyristors 22 have the n-type GaAs layer 23 in common with each other. In other words, the n-type GaAs layer 23 is a common layer of the light emitting thyristors 22.

In this regard, materials of the p-type layers and the n-type layers of the light emitting thyristor 22 are not limited to those described above, but can be made of, for example InGaP or the like.

<Common Wiring Portion 40>

As shown in FIG. 1, the common wiring portion 40 is formed on the IC substrate 10 for connection with the external driving circuit (not shown). The common wiring portion 40 includes an anode common wiring portion 41, a gate common wiring portion 42 and a cathode common wiring portion 43.

As shown in FIG. 1, the anode common wiring portion includes anode pads $44A_1$-$44A_n$ provided on the IC substrate 10, and anode common wirings $45A_1$-$45A_n$ respectively led from the anode pads $44A_1$-$44A_n$. The anode pads $44A_1$-$44A_n$ are provided for connection with the external driving circuit (not shown). Each of the anode pads $44A_1$-$44A_n$ is used to control four of the 4n light emitting thyristors 22 arranged in the longitudinal direction. The anode pads $44A_1$-$44A_n$ are arranged in the longitudinal direction, and the number of the anode pads $44A_1$-$44A_n$ is n, where n is a positive integer.

The anode common wirings $45A_1$-$45A_n$ extend in T-shape (as seen in plan view) from the anode pads $44A_1$-$44A_n$ toward the light emitting thyristor array 20.

As shown in FIG. 1, the gate common wiring portion includes four gate pads $46G_1$-$46G_4$ provided on the IC substrate 10, and four gate common wirings $47G_1$-$47G_4$ that extend from the gate pads $46G_1$-$46G_4$ and further extend in the longitudinal direction of the IC substrate 10.

As shown in FIG. 1, the cathode common wiring portion 43 includes a cathode pad 48K provided on the IC substrate 10, and a cathode common wiring 49K that extends from the cathode pad 48K and further extends in the longitudinal direction of the IC substrate 10.

Further, the gate common wiring portion 42 and the cathode common wiring portion 43 are provided on an opposite side to the anode common wiring portion 41 with respect to the light emitting thyristor array 20 on the IC substrate 10.

<Lead-out Wiring Portion 50>

The lead-out wiring portion 50 is configured to connect the light emitting thyristors 22 (formed by fabricating the semiconductor epitaxial film 100) and the common wiring portion 40 provided on the IC substrate 10. The lead-out wiring portion 50 includes an anode lead-out wiring portion 51A, a gate lead-out wiring portion 52G and a cathode lead-out wiring portion 53K.

<Anode Lead-out Wiring Portion 51A>

As shown in FIG. 3B, the anode lead-out wiring portion 51A includes anode electrodes 54A formed on (and contacts) the p-type AlGaAs layers 26 (i.e., an anode region) of the light emitting thyristors 22, and anode lead-out wirings 55A lead from the anode electrodes 54A. The anode lead-out wirings 55A linearly extend toward the anode common wirings $45A_1$-$45A_n$, and are connected to the anode common wirings $45A_1$-$45A_n$.

The anode electrodes 54A are composed of, for example, AlGaAs. However, material of the anode electrodes 54A is not limited to AlGaAs. As shown in FIG. 1, the anode lead-out wirings 55A extend linearly from the anode electrodes 54A toward the anode common wirings $45A_1$-$45A_n$. An insulation layer 56 composed of an oxide film is formed for preventing each anode lead-out wiring 55A from contacting other layers (than the p-type AlGaAs layers 26) of the light emitting thyristor 22.

<Gate Lead-out Wiring Portion 52G>

As shown in FIG. 3A, the gate lead-out wiring portion 52G includes gate electrodes 57G formed on (and contacts) the n-type AlGaAs layer 25 (i.e., a gate), and gate lead-out wirings 58G led from the gate electrodes 57G. The gate lead-out wirings 58G linearly extend toward the four gate common wirings $47G_1$-$47G_4$, and are connected to the gate common wirings $47G_1$-$47G_4$. An insulation layer 59 composed of an oxide film is formed for preventing each gate lead-out wiring 58G from contacting other layers (than the n-type AlGaAs layer 25) of the light emitting thyristor 22.

Further, a not shown insulation film is formed for preventing each gate lead-out wiring 58G from contacting the cathode common wiring 49K and the gate common wirings $47G_1$-$47G_4$ that cross the gate lead-out wirings 58G. With such a structure, short circuiting between the gate lead-out wirings 58G and the cathode common wiring 49K or the gate common wirings $47G_1$-$47G_4$ is prevented.

<Cathode Lead-out Wiring Portion 53K>

As shown in FIG. 3B, the cathode lead-out wiring 53K includes cathode electrodes 60K formed on (and contacts) the n-type GaAs layer 23 (i.e., the common layer of the 4n light emitting substrates 22), and cathode lead-out wirings 61K led from the cathode electrodes 60K. The cathode lead-out wirings 61K linearly extend toward the cathode common wiring 49K, and are connected to the cathode common wiring 49K. As shown in FIG. 1, the cathode electrodes 60K are provided on the n-type GaAs layer 23 and between the light emitting thyristors 22.

The cathode lead-out wirings 61K linearly extend from the cathode electrodes 60K to the cathode common wiring 49K, and are connected to the cathode common wiring 49K. An insulation layer 62 is formed for preventing each cathode lead-out wiring 61K from contacting the n-type GaAs layer 23 as shown in FIG. 3B.

The anode lead-out wiring portion 51A, the gate lead-out wiring portion 52G, and the cathode lead-out wiring portion 53K constitute the circuit on the IC substrate 10 as shown in FIG. 2.

<Manufacturing Method of Semiconductor Epitaxial Film 100>

Next, a manufacturing method of the semiconductor thyristor array chip 1A according to the first embodiment will be described.

Figure 4A:
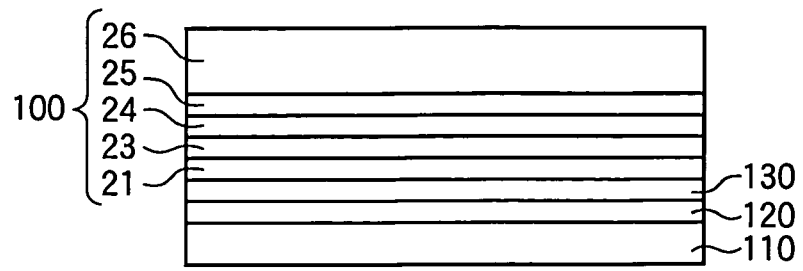
FIGS. 4A, 4B and 4C are schematic views for illustrating a manufacturing process of a semiconductor epitaxial film according to the first embodiment of the present invention.
Figure 4B:
Figure 4C:
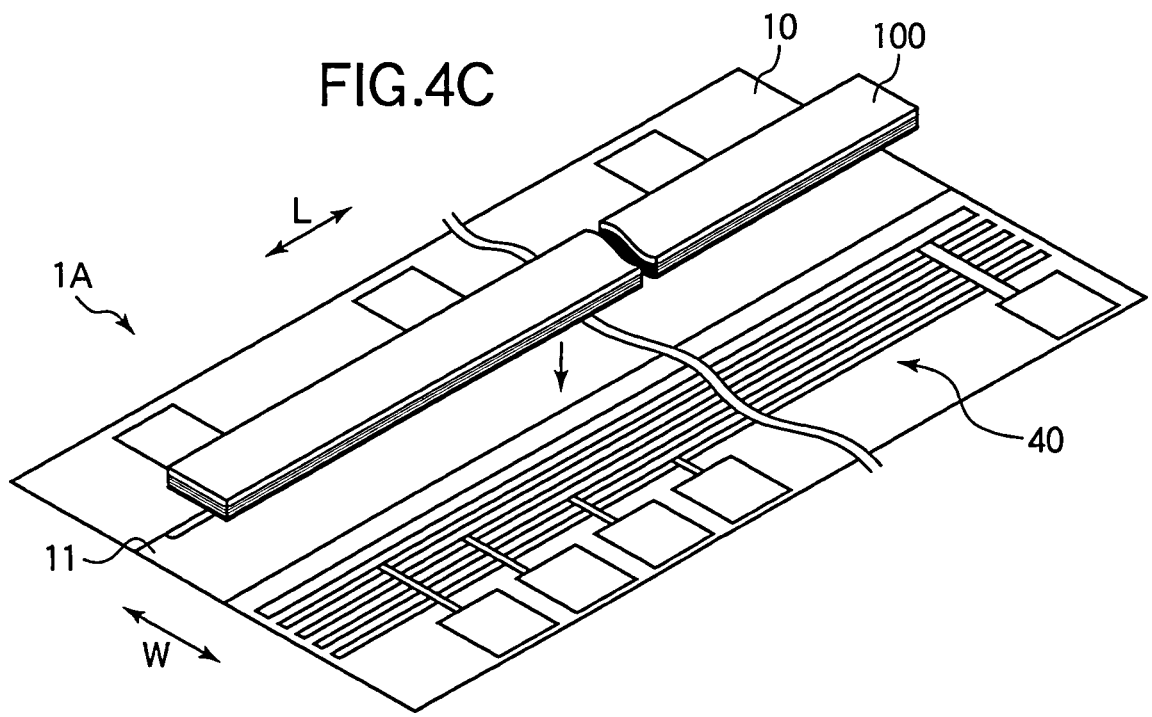

First, a manufacturing method of the semiconductor epitaxial film 100 will be described. FIGS. 4A, 4B and 4C are schematic views for illustrating a manufacturing process of the semiconductor epitaxial film 100.

As shown in FIG. 4A, a buffer layer 120, a sacrificial layer 130, the bonding layer 21, the n-type GaAs layer 23, the p-type GaAs layer 24, the n-type AlGaAs layer 25 and the p-type AlGaAs layer 26 are layered in this order on a mother substrate 110 using MOCVD (Metal Organic Chemical Vapor Deposition) method or the like.

The buffer layer 120 is, provided for forming (growing) the bonding layer 21, the n-type GaAs layer 23, the p-type GaAs layer 24, the n-type AlGaAs layer 25 and the p-type AlGaAs layer 26 thereon. In this embodiment, material of the buffer layer 120 is not limited.

The sacrificial layer 130 is provided for separating of the bonding layer 21, the n-type GaAs layer 23, the p-type GaAs layer 24, the n-type AlGaAs layer 25 and the p-type AlGaAs layer 26 (formed on the sacrificial layer 130) from the mother substrate 110.

The bonding layer 21 is provided for bonding to another substrate (i.e., a substrate different from the mother substrate 110) as described later. The n-type GaAs layer 23, the p-type GaAs layer 24, the n-type AlGaAs layer 25 and the p-type AlGaAs layer 26 constitute the light emitting thyristor 22.

Then, as shown in FIG. 4B, the sacrificial layer 130 is selectively etched (removed) using hydrogen fluoride (HF) liquid. When using HF liquid, etching speed of the sacrificial layer 130 is faster than etching speeds of the bonding layer 21, the n-type GaAs layer 23, the p-type GaAs layer 24, the n-type AlGaAs layer 25 and the p-type AlGaAs layer 26, and therefore the sacrificial layer 130 can be selectively etched. With such a process, a stack of the bonding layer 21, the n-type GaAs layer 23, the p-type GaAs layer 24, the n-type AlGaAs layer 25 and the p-type AlGaAs layer 26 is separated from the mother substrate 110. Then, the stack of the bonding layer 21, the n-type GaAs layer 23, the p-type GaAs layer 24, the n-type AlGaAs layer 25 and the p-type AlGaAs layer 26 (separated from the mother substrate 110) is washed using water so as not to leave HF liquid, with the result that the semiconductor epitaxial film 100 is formed.

<Manufacturing Method of Light Emitting Thyristor Array Chip 1A>

Next, as shown in FIG. 4C, the semiconductor epitaxial film 100 is pressed against the insulation film 11 on the IC substrate 10, so that the bonding layer 21 of the semiconductor epitaxial film 100 is bonded to the insulation film 11 by means of intermolecular force. In this regard, the insulation film 11 with high flatness and the common wiring portion 40 are preliminarily formed on the IC substrate 10, before the semiconductor epitaxial film 100 is bonded to the IC substrate 10 via the insulation film 11.

Then, the semiconductor epitaxial film 100 bonded to the IC substrate 10 is fabricated using etching so as to form the 4n light emitting thyristors 22 each having a configuration as shown in FIGS. 3A and 3B.

Then, as shown in FIG. 3A, the insulation layers 56 and 59, the anode electrodes 54A and the gate electrodes 57G are formed on the light emitting thyristors 22. Further, as shown in FIG. 1, the anode lead-out wirings 55A are formed so as to connect the anode electrodes 54A and the anode common wirings $45A_1$-$45A_n$.

Furthermore, the gate lead-out wirings 58G are formed so as to connect the gate electrodes 57G and the gate common wirings $47G_1$-$47G_4$.

As shown in FIG. 3B, the cathode electrodes 60K and the insulation layers 62 are formed on the n-type GaAs layer 23 (i.e., the cathode) and between the light emitting thyristors 22. Further, the cathode lead-out wirings 61K are formed so as to connect the cathode electrodes 60K and the cathode common wiring 49K.

With such processes, the light emitting thyristor array chip 1A according to the first embodiment is completed.

<Method of Using Light Emitting Thyristor Array Chip>

Next, a method of using the light emitting thyristor array chip 1A will be described.

The cathode electrodes 60K contacting the n-type GaAs layers 23 of the light emitting thyristors 22 are at a ground potential, since the cathode pad 48K is grounded as shown in FIG. 2. Each light emitting thyristor 22 is driven by turning on/off of a voltage between the anode electrode 54A and the gate electrode 57G.

To be more specific, when the light emitting thyristor 22 is not driven, the anode electrode 54A is set at the ground potential. With such a setting, a current does not flow from the anode electrode 54A to the cathode electrode 60K, and therefore the light emitting thyristor 22 does not emit light.

In order to activate the light emitting thyristor 22, the gate electrode 57G is set at the ground potential, and the anode electrode 54A is set at a higher potential. With such a setting, a current flows from the anode electrode 54A to the cathode electrode 60K, and therefore the light emitting thyristor 22 emits light at a p-n junction.

In order to stop the light emission, the anode electrode 54A is set at the ground potential, and then the gate electrode 57G is set at a predetermined potential.

<Advantages>

The light emitting thyristor array chip 1A according to the first embodiment of the present invention is configured as described above, and therefore the following advantages can be obtained.

FIG. 5 shows a light emitting thyristor array chip 200 according to a comparison example. Hereinafter, the advantages of the light emitting thyristor array chip 1A (FIG. 1) according to the first embodiment will be described by comparison with the comparison example (FIG. 5).

In the light emitting thyristor array chip 200 of the comparison example shown in FIG. 5, a cathode electrode 260K is formed on an n-GaAs layer 223 and extends linearly in the longitudinal direction of an IC substrate 210, and contacts the light emitting thyristors 220. Therefore, the cathode electrode 260K crosses gate lead-out wirings 258G (extending from gate electrodes 257G to gate common wirings $247G_1$-$247G_4$).

In contrast, in the light emitting thyristor array chip 1A (FIG. 1) according to the first embodiment, the cathode electrodes 60K are formed on the n-type GaAs layer 23 (i.e., the common layer) and between the light emitting thyristors 22. Therefore, the cathode lead-out wirings 61K extending linearly from the cathode electrodes 60K toward the cathode common wiring 49K do not cross other lead-out wirings (i.e., the anode lead-out wirings 55A and the gate lead-out wirings 58G).

Further, in the light emitting thyristor array chip 1A (FIG. 1) according to the first embodiment, none of the electrodes (i.e., the anode electrodes 54A, the gate electrodes 57G and the cathode electrodes 60K) is disposed on the anode lead-out wirings 55A, the gate lead-out wirings 58G and the cathode lead-out wirings 61K. Therefore, the wirings led from the respective electrodes (the anode lead-out wirings 55A, the gate lead-out wirings 58G and the cathode lead-out wirings 61K) do not cross other electrodes.

In this regard, although the gate lead-out wirings 58G cross the cathode common wiring 49K and the gate common wirings $47G_1$-$47G_4$ as shown in FIG. 1, short circuiting therebetween is prevented by the above described insulation layer.

As described above, according to the first embodiment, the lead-out wiring portion 50 for connecting the light emitting thyristors 22 and the common wiring portion 40 has no crossing of wirings and electrodes, and therefore short circuiting can be prevented.

Further, in the light emitting thyristor array chip 200 of the comparison example shown in FIG. 5, the cathode electrode 260K is provided (on the n-type GaAs layer 223) on the same side as a cathode common wiring portion 240, with the result that the size of the light emitting thyristor array 220 and the light emitting thyristor array chip 200 needs to be increased in the widthwise direction (indicated by an arrow W in FIG. 5) of the IC substrate 10.

In contrast, in the light emitting thyristor array chip 1A of the first embodiment of the present invention, the cathode electrodes 60K are provided between the light emitting thyristors 22 on the n-type GaAs layer 23. Therefore, it becomes unnecessary to increase the size of the light emitting thyristor array chip 1A and the light emitting thyristor array chip 100.

Second Embodiment

Next, an optical print head 300 using a light emitting thyristor array chip 1B (as a semiconductor device) according to the second embodiment will be described with reference to FIGS. 6 through 8.

Figure 6:
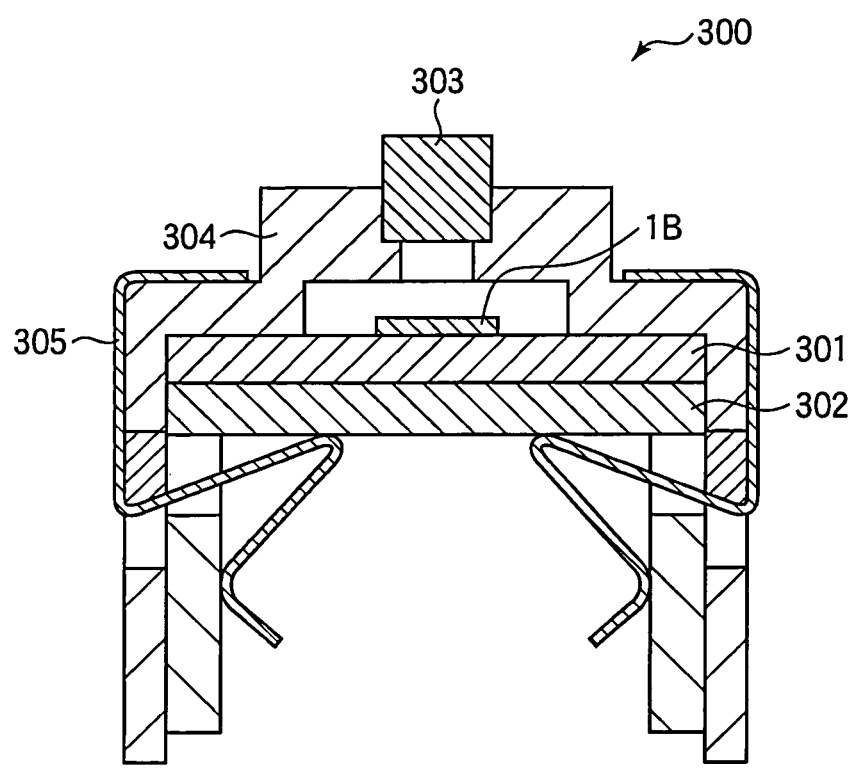
FIG. 6 is a sectional view showing an optical print head using a light emitting thyristor array chip (as a semiconductor device) according to the second embodiment of the present invention.
Figure 7A:
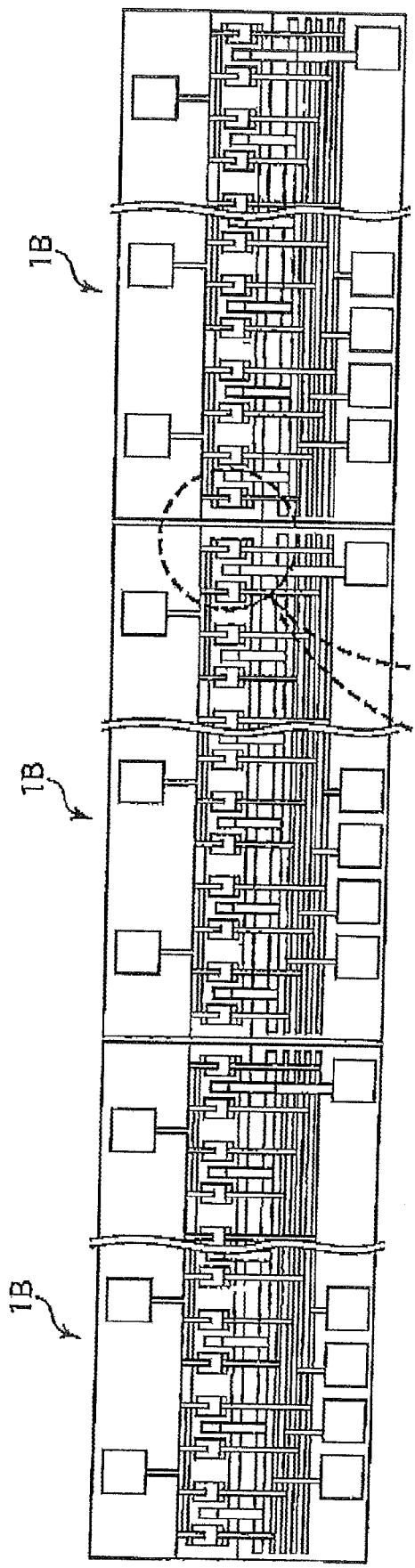
FIG. 7A is a plan view showing an optical print head using a light emitting thyristor array chip according to the second embodiment of the present invention.
Figure 7B:
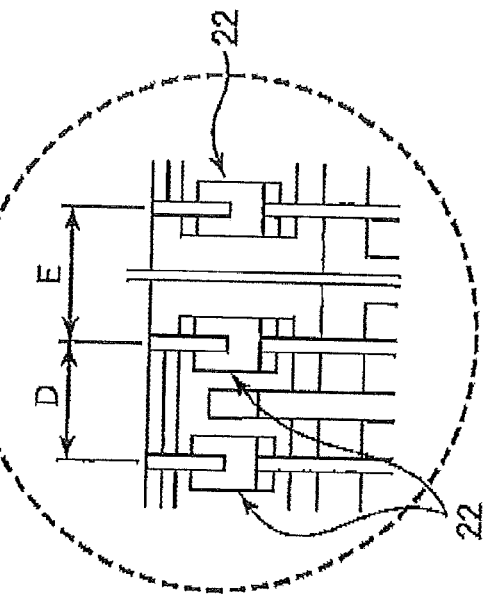
FIG. 7B is an enlarged view showing a part of the optical print head of FIG. 7A.

FIGS. 6 and 7A are a sectional view and a plan view showing the optical print head 300 using the light emitting thyristor array chip 1B according to the second embodiment. FIG. 7B is an enlarged view showing a part of the optical print head 300 in FIG. 7A. FIG. 8 is a plan view showing the light emitting thyristor array chip 1B according to the second embodiment.

The optical print head 300 is configured to irradiate a surface of a photosensitive drum (not shown) with light so as to form a latent image thereon. As shown in FIG. 6, the optical print head 300 includes the light emitting thyristor array chip 1B and a COB (i.e., Chip On Board) substrate 301 onto which the light emitting thyristor array chip 1B is bonded, a base substrate 302, a lens array 303, a lens holder 304 holding the lens array 303, and a clamp 305 for fixing the base substrate 302 and the lens holder 304 to the COB substrate 301.

As shown in FIG. 7A, a plurality of light emitting thyristor array chips 1B are linearly arranged on the COB substrate 301 in the longitudinal direction of the COB substrate 301.

The light emitting thyristor array chip 1B of the second embodiment is different from the light emitting thyristor array chip 1A of the first embodiment in the number and positions of the cathode electrodes 60K contacting the n-type GaAs layer 23 (i.e., the common layer of the light emitting thyristors 22).

Figure 8:
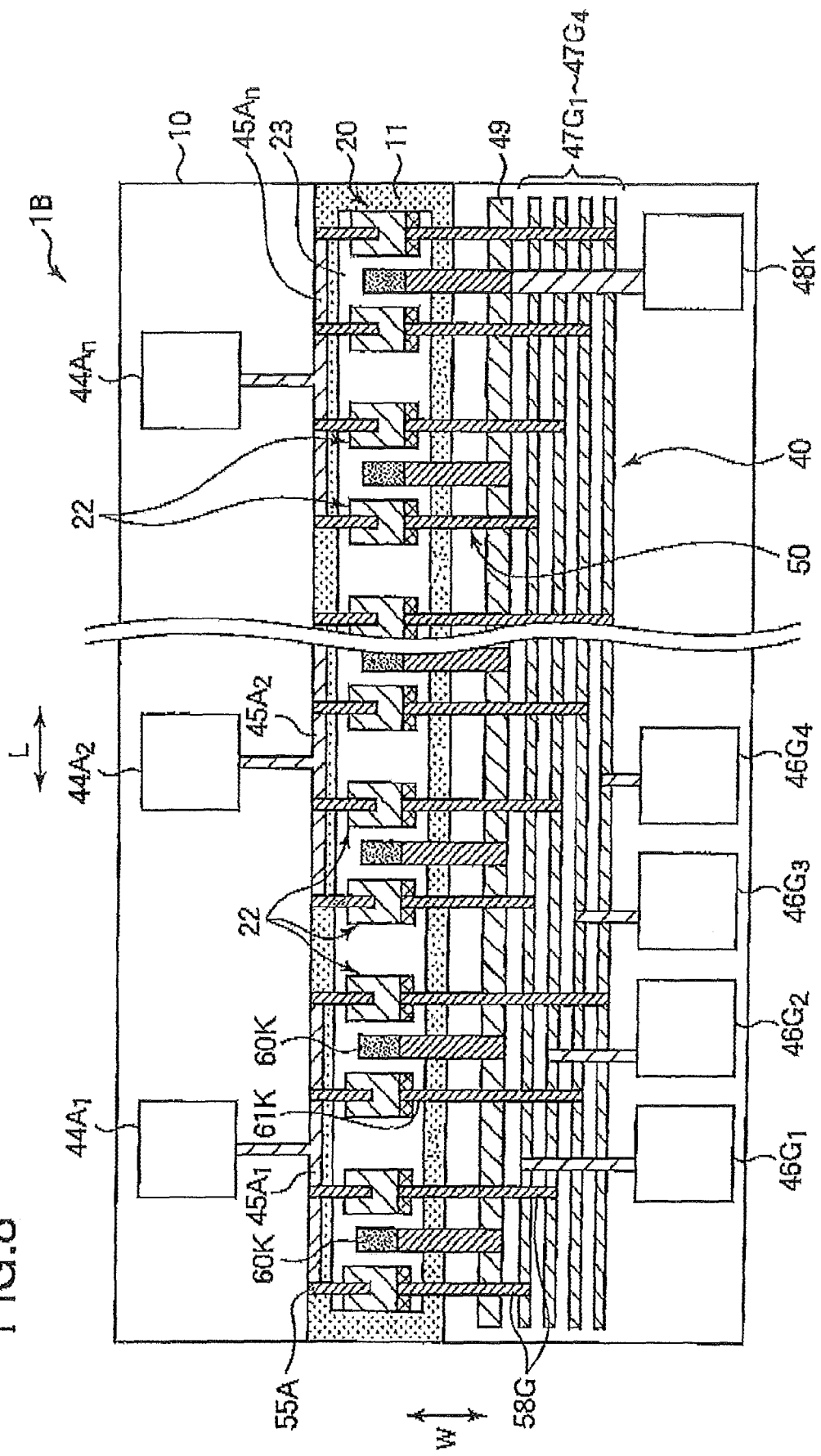
FIG. 8 is a plan view showing the light emitting thyristor array chip according to the second embodiment of the present invention.

As shown in FIG. 8, among the 4n light emitting thyristors 22 (where n is a positive integer), the cathode electrodes 60K are provided between the (4n−3)-th light emitting thyristor 22 and the (4n−2)-th light emitting thyristor 22, and also provided between the (4n−1)-th light emitting thyristor 22 and the 4n-th light emitting thyristor 22. The cathode electrodes 60K are arranged in the arranging direction of the light emitting thyristors 22 at constant intervals. With such an arrangement, the number of cathode electrodes 60K is smaller than in the first embodiment, and the number of cathode lead-out wirings 61K led from the cathode electrodes 60K is also smaller than in the first embodiment.

According to the light emitting thyristor array chip 1B of the second embodiment of the present invention, the number of the cathode electrodes 60K is smaller than that in the light emitting thyristor array chip 1A of the first embodiment as described above. However, each light emitting thyristor 22 is adjacent to the cathode electrode 60K on only one side (see FIG. 8), and therefore the respective light emitting thyristors 22 are applied with constant voltages. Therefore, amounts of lights emitted by the respective light emitting thyristors 22 are constant.

This configuration is advantageous for the following reason.

In the optical print head 300, as shown in FIG. 7B, it is necessary that an interval D between the adjacent light emitting thyristors 22 of each light emitting thyristor array chip 1B equals to an interval E between endmost light emitting thyristors 22 of the adjacent light emitting thyristor array chips 1B. For this purpose, there may be the case where each light emitting thyristor array chip 1B has no sufficient space for the cathode electrode 60K at an end side of the endmost light emitting thyristor 22.

In such a case, the cathode electrodes 60K can only be provided on one side of each of the endmost light emitting thyristors 22 of the light emitting thyristor array chip 1B, while the cathode electrodes 60K can be provided on both sides of each of other light emitting thyristors 22. With such an arrangement, the endmost light emitting thyristors 22 of the light emitting thyristor array chip 1B are applied with higher voltage than the other light emitting thyristors 22, so that the light emission amounts of the light emitting thyristors 22 are not constant.

However, according to the second embodiment, each of the light emitting thyristor 22 is adjacent to one cathode electrode 60K on only one side, and therefore the light emitting thyristors 22 are applied with constant voltages. Therefore, amounts of lights emitted by the respective light emitting thyristors 22 of the light emitting thyristor array chip 1B are constant.

Finally, an example of a configuration of an image forming apparatus using the light emitting thyristor array chip 1B will be described with reference to FIG. 9.

Figure 9:
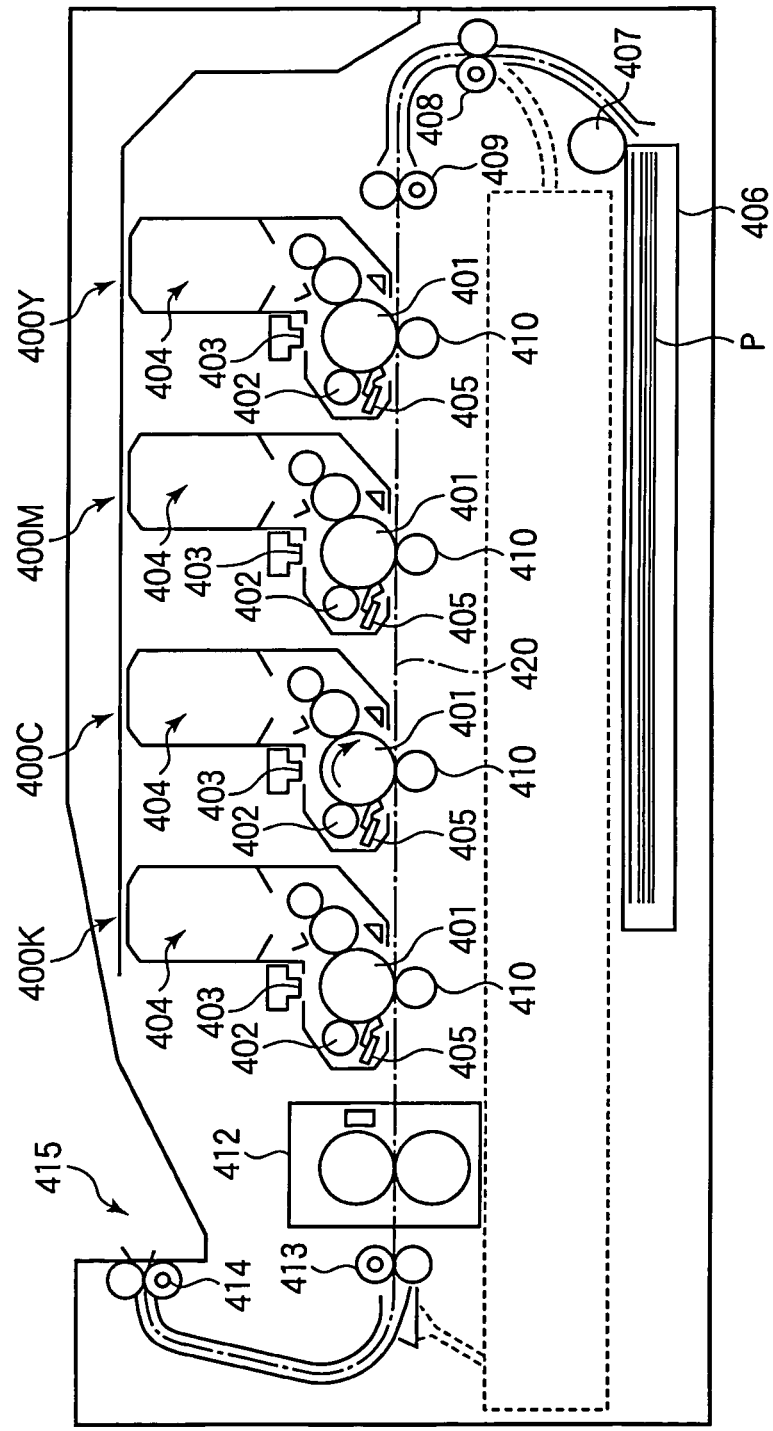
FIG. 9 is a schematic side view showing an example of an image forming apparatus using the optical head according to the second embodiment of the present invention.

As shown in FIG. 9, an image forming apparatus includes four process units (i.e., image forming units) 400Y, 400M, 400C and 400K that respectively form images of yellow, magenta, cyan and black. The process units 400Y, 400M, 400C and 400K are arranged in this order from the upstream to the downstream along a feeding path 420 of a recording medium P.

Each of the process units (collectively referred to as a process unit 400) includes a photosensitive drum 401 as an image bearing body rotatable in the direction shown by an arrow, and includes a charging unit 402, an exposing unit 403, a developing unit 404 and a cleaning unit 405 disposed along the circumference of the photosensitive body 401. The charging unit 402 uniformly charges the surface of the photosensitive drum 401. The exposing unit 403 selectively exposes the surface of the photosensitive drum 401 with light to form a latent image. The optical print head 300 (FIG. 6) of the second embodiment is used as the exposing unit 403. The developing unit 404 supplies the toner of the predetermined color to the surface of the photosensitive drum 401 to develop the latent image. The cleaning unit 405 removes the residual toner from the surface of the photosensitive drum 401.

A sheet cassette 406 is mounted to the lower part of the image forming apparatus, which stores the recording media P. A feeding roller 407 is disposed above the sheet cassette 406, for feeding the recording medium P one by one. Registration roller pairs 408 and 409 are disposed on the downstream side of the feeding roller 407 in the feeding direction of the recording medium P, which correct the skew of the recording medium P and feed the recording medium P to the process units 400Y, 400M, 400C and 400K. The drums and rollers of the respective devices are driven by not shown driving sources and not shown gears.

Transfer rollers (i.e., a transfer unit) 410 are disposed so as to face the photosensitive drums 401 of the process units 400Y, 400M, 400C and 400K. Predetermined electric potentials are applied between the photosensitive drums 401 and the transfer rollers 410 for transferring the toner image from the photosensitive drums 401 to the recording medium P.

A fixing unit 412 includes a heating roller and a backup roller, and applies heat and pressure to the toner having been transferred to the recording medium P, so as to fix the toner to the recording medium P. Ejection roller pairs 413 and 414 are disposed on the downstream side of the fixing unit 412, which eject the recording medium P to a stacker portion 415.

The image forming operation is as follows. First, the feeding roller 407 is driven to feed the recording medium P out of the sheet cassette 406 one by one. The registration roller pairs 408 and 409 correct the skew of the recording medium P, and feed the recording medium P to the process unit 400Y. In the process unit 400Y, the surface of the photosensitive body 401 (uniformly charged by the charging unit 402) is exposed by the exposing unit 403, so that a latent image is formed thereon. The latent image is developed by the developing unit 404, and the developed toner image is transferred to the surface of the recording medium P. Similarly, the recording medium P passes the process units 400M, 400C and 400K, and the toner images of the respective colors are transferred to the recording medium P in an overlapping manner. Then, the recording medium P is fed to the fixing unit 412 where the toner image is fixed to the recording medium P. Further, the recording medium P is ejected by the ejection roller pairs 413 and 414 to the stacker portion 415 outside the image forming apparatus. With the above described process, the color image is formed on the recording medium P.

Since the optical print head 300 (FIG. 6) is used as the exposing unit 403 as described above, the image forming apparatus has high reliability.

Here, the optical print head 300 (as the exposing unit 403) uses the light emitting thyristor 1B (FIGS. 7A, 7B and 8). However, it is also possible to use the light emitting thyristor 1A (FIG. 1) instead of the light emitting thyristor 1B.

Although the n-type GaAs layer 23 as the cathode (i.e., the second terminal) is the common layer of the light emitting thyristors 22 in the above described first and second embodiments, the present invention is not limited thereto. For example, it is also possible that the n-AlGaAs layer 25 (i.e., the third terminal) is the common layer instead of the n-type GaAs layer 23.

Further, although the light emitting thyristor array 20 includes 4n light emitting thyristors 22 in the above described first and second embodiments, the present invention is not limited thereto. It is only necessary that the light emitting thyristor array 20 includes at least two light emitting thyristors 22. When the light emitting thyristor array 20 includes at least two light emitting thyristors 22, it is possible to form the common layer of the two light emitting thyristors 22, and to form the lead-out wiring portion led from the common layer. With such a configuration, it becomes possible to reduce the possibility of short circuiting, and it becomes unnecessary to increase the size of the light emitting thyristor array 20.

While the preferred embodiments of the present invention have been illustrated in detail, it should be apparent that modifications and improvements may be made to the invention without departing from the spirit and scope of the invention as described in the following claims.

What is claimed is:

1. A semiconductor device comprising:
   a substrate;
   a three-terminal light emitting element array provided on said substrate and including a plurality of three-terminal light emitting elements which are substantially linearly arranged, each of said plurality of three-terminal light emitting elements including a first terminal, a second terminal and a third terminal, said third terminal being used to control a current between said first and second terminals; and a lead-out wiring portion connected to said plurality of three-terminal light emitting elements;

wherein said three-terminal light emitting element array includes a common layer formed of a semiconductor layer and provided across two or more three-terminal light emitting elements adjacent to each other, said common layer mutually connecting said second terminals of said two or more three-terminal light emitting elements;

wherein a plurality of electrodes are provided between mutually adjacent three-terminal light emitting elements, said electrodes connecting said lead-out wiring portion and said common layer; and wherein all of said three-terminal light emitting elements are equally distanced from said electrodes adjacent thereto.

2. The semiconductor device according to claim 1, wherein said plurality of three-terminal light emitting elements are formed in a semiconductor thin film, and
wherein said semiconductor thin film is bonded to a surface of said substrate.

3. The semiconductor device according to claim 1,
wherein said lead-out wiring portion includes wirings led out from said electrodes, and
wherein said wirings are provided at constant intervals in an arranging direction of said plurality of three-terminal light emitting elements.

4. The semiconductor device according to claim 3, wherein said wirings are provided only on one side of each three-terminal light emitting element.

5. An optical print head comprising:
said semiconductor device according to claim 1.

6. An image forming apparatus comprising:
said optical print head according to claim 5,
an image bearing body having a surface exposed by said optical print head so as to form a latent image;
a developing unit that develops said latent image; and
a transfer unit that transfer said latent image to a medium.

7. The semiconductor device according to claim 1, wherein said lead-out wiring portion is led out from said common layer in a direction substantially perpendicular to an arranging direction of said plurality of three-terminal light emitting elements.

8. The semiconductor device according to claim 1, wherein said plurality of three-terminal light emitting elements and said electrodes are arranged substantially linearly in an arranging direction of said plurality of three-terminal light emitting elements.

* * * * *